United States Patent [19]

Ide et al.

[11] 4,048,035
[45] Sept. 13, 1977

[54] PHOTOPOLYMERIZABLE COMPOSITION

[75] Inventors: Fumio Ide; Tsuneo Kodama, both of Otake, Japan

[73] Assignee: Mitsubishi Rayon Co., Ltd., Tokyo, Japan

[21] Appl. No.: 641,763

[22] Filed: Dec. 17, 1975

[51] Int. Cl.$^2$ .................. C08F 8/00; G03C 1/68; G03C 5/00
[52] U.S. Cl. .................. 204/159.15; 96/35.1; 96/115 R; 260/861; 260/865; 260/866; 260/868; 260/872; 427/54; 526/320; 526/328
[58] Field of Search .................. 204/159.15, 159.19; 260/75 VA, 861, 372, 864, 865, 866, 868; 96/35.1, 115 R

[56] References Cited

U.S. PATENT DOCUMENTS

| | | | |
|---|---|---|---|
| 3,321,552 | 5/1967 | Temin et al. | 260/860 |
| 3,556,791 | 1/1971 | Suzuki et al. | 96/35.1 |
| 3,660,528 | 5/1972 | Kostenko | 260/861 |
| 3,678,102 | 7/1972 | Isard et al. | 260/514 R |
| 3,873,505 | 3/1975 | Laakso et al. | 260/75 UA |

*Primary Examiner*—Murray Tillman
*Assistant Examiner*—Thurman K. Page

*Attorney, Agent, or Firm*—Oblon, Fisher, Spivak, McClelland & Maier

[57] ABSTRACT

A photopolymerizable composition for image formation, which comprises 30 – 95 wt. % of an unsaturated polyester having an acid value of 5 – 100 which is the condensation product of a carboxylic acid component containing more than 40 mole % of a carboxylic acid compound having the formula

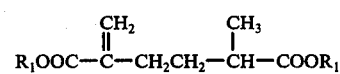

[I]

wherein $R_1$ represents hydrogen or a $C_{1-4}$ lower alkyl with a polyol component containing more than 30 mole % of a polyol having the formula

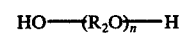

[II]

wherein $R_2$ represents $C_{2-4}$ alkylene or a derivative thereof and n is an integer of 2 – 5 and 70 – 5 wt. % of a photopolymerizable unsaturated monomer and a photosensitizer.

6 Claims, No Drawings

PHOTOPOLYMERIZABLE COMPOSITION

BACKGROUND OF THE INVENTION

1. Field of the Invention

The present invention relates to novel photopolymerizable compositions for image formation.

2. Description of the Prior Art

Photopolymerizable compositions are useful for image formation. In turn the images are used as reliefs for printing plates or pattern plates to prepare papier-mache molds (hereinafter referred to as a matrix) or as plates for dry-offset printing and the like. The photopolymerizable compositions so used should be characterized by having an image forming portion which is rapidly photopolymerized under a light image, and a non-image forming portion which can be easily removed by washing with water, an aqueous solution or some other solvent. The image reproducibility of the compositions is high, and the image forming portion has high chemical resistance and mechanical properties. When such a relief is used as the printing plate, it is necessary that the printing plate prepared by using a photopolymerizable composition have high strength and wear resistance and high printing resistance, whereby the fine lines and fine half-tone dots of the printing plate should not broaden and wear-out as a result of printing. When the relief is used as a pattern plate, it is necessary that the pattern plate have sufficient hardness, strength and water resistance whereby the fine lines and fine half-tone dots of the printing plate prepared by molding lead in the matrix prepared in turn by using the pattern plate should not be broadened and worn-out by repeating the preparation of the matrix.

The conventional photopolymerizable compositions which can be photopolymerized by light-irradiation include an unsaturated polyester resin, a vinyl monomer and a photosensitizer. The resin compositions can be used for image forming compositions. The unsaturated polyesters included in the resin compositions can be produced by the polycondensation of a polyol with an unsaturated carboxylic acid or an ester thereof such as maleic acid, maleic anhydride, dimethyl maleate, diethyl maleate, fumaric acid, dimethyl furmarate, citraconic acid, citraconic anhydride, itaconic acid, itaconic anhydride, dimethyl itaconate and the like. Among these unsaturated polyesters, unsaturated polyesters produced by the polycondensation of a polyol with maleic acid (hereinafter referred to as maleic acid type unsaturated polyesters) have special polymerizable characteristics and the selection of the vinyl monomer component is limited. The resin compositions which contain styrene or a styrene derivative as the vinyl monomer component have relatively high photopolymerizing properties when exposed to light, however, the resulting photopolymerized products posssess inferior mechanical strength. Accordingly, it is hard to use these resin compositions as a photopolymerizable composition for image formation.

The unsaturated polyesters produced by the polycondensation of a polyol with itaconic acid (hereinafter referred to as itaconic acid type unsaturated polyesters) are easily colored in production which decreases the photopolymerizability of the composition when exposed to light. Thermal polymerization of the unsaturated group in the polyester results during the production of the itaconic acid type unsaturated polyesters and it is difficult to produce unsaturated polyesters having desirable characteristics. A need, therefore, continues to exist for a photopolymerizable composition which is rapidly photopolymerized when exposed to light and which results in an image which has good chemical resistance and mechanical properties.

SUMMARY OF THE INVENTION

Accordingly, one object of the present invention is to provide photopolymerizable compositions for image formation which have the desirable characteristics that the unphotopolymerized unsaturated polyester is easily washed from the image with water or some other solvent and the unsaturated polyester is not photopolymerized by light thereby obtaining an image with excellent chemical and mechanical properties.

Briefly, this object and the other objects of the present invention as hereinafter will become more readily apparent can be attained by a photopolymerizable composition for image formation which comprises 30–95 wt. % of an unsaturated polyester having an acid value of 5–100 which is produced by the polycondensation of a carboxylic acid compound having the formula

wherein $R_1$ represents hydrogen or $C_{1-4}$ lower alkyl, with a polyol having the formula

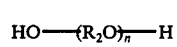

wherein $R_2$ represents $C_{2-4}$ alkylene or a derivative thereof and $n$ is an integer of 2–5; 70–5 wt. % of an unsaturated monomer and a photosensitizer.

DETAILED DESCRIPTION OF THE PREFERRED EMBODIMENTS

The unsaturated polyesters having an acid value of 5–100 can be produced by polycondensing more than 40 mole % of a carboxylic acid compound of formula [I] with more than 30 mole % of a polyol of formula [II] to give an unsaturated polyester having a hydroxyl value of 5–200 and then reacting the unsaturated polyester with a polybasic carboxylic acid or acid anhydride thereof. The term "acid value" means the acid value of terminal groups without consideration of the impurities. The unsaturated carboxylic acid compounds of formula [I] include 1-hexene-2, 5-dicarboxylic acid and lower alkyl esters thereof (α-methylene- δ-methyl adipic acid and lower alkyl esters thereof).

The unsaturated polyesters used in the composition of the present invention contain the unsaturated structure:

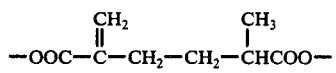

which has no special selectivity for photopolymerizable unsaturated monomers, which is quite a different property from the maleic acid type unsaturated polyesters. Accordingly various photopolymerizable unsaturated monomers can be combined with the unsaturated polyesters to form photopolymerizable compositions which have the desired characteristics for image formation.

Other advantages of the present composition include the fact that when the unsaturated polyesters are photopolymerized, excellent photopolymerized products having enough flexiblity and high strength and high chemical resistance can be obtained because of the structure of the polyester.

In the preparation of the unsaturated polyesters the polyesters do not become colored and partially gelled, and because of the fact the photopolymerizability of the unsaturated polyester when exposed to light is excellent. The unsaturated polyesters used in the present invention have superior solubility in water andother solvents compared to the other conventional unsaturated polyesters, because the polyol of formula [II] and the carboxylic acid compound of formula [I] are used as the starting materials. Accordingly, the non-image forming portion of the composition after the image has been formed can be easily removed by washing with a solvent.

The unsaturated polyester can be produced by polycondensing a carboxylic acid component containing more than 40 mole % of the carboxylic acid compound of formula [I] with a polyol component containing more than 30 mole % of the polyol of formula [II]. If the content of the carboxylic acid compound of formula [I] is less than 40 mole % in the total carboxylic acid component, the resulting unsaturated polyester has low photopolymerizability when exposed to light; and the photopolymerized product has inferior chemical and mechanical properties such as strength, water resistance and chemical resistance. Accordingly, such a carboxylic acid component is not suitable for use as the base of the photopolymerizable composition. Suitable carboxylic acids which can be combined with the carboxylic acid compound of formula [I] include oxalic acid, malonic acid, methylmalonic acid, succinic acid, sebacic acid, adipic acid, phthalic acid, phthalic anhydride, isophthalic acid, terephthalic acid, tetrahydrophthalic acid, thioglycolic acid and di-lower alkyl esters thereof.

If the content of the polyol of formula [II] is less than 30 mole % of the total polyol component, the resulting unsaturated polyester has low solvent solubility. Accordingly, it is difficult to prepare a photopolymerizable composition for image formation which has high resolving power, because of its low development properties. The photopolymerized product prepared by using such a photopolymerizable composition has inferior hardness and water resistance and accordingly, it is not suitable for use as the base of the photopolymerizable composition. If a polyol having the formula HO — $R_2$ — OH is mainly used, the resulting photopolymerized product including the photopolymerized unsaturated polyester has high hardness but inferior flexibility. If a polyol having the formula

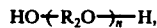

wherein $n$ is more than 6, is mainly used, the resulting photopolymerized product has inferior solvent resistance and water resistance. Suitable polyols of formula [II] include diethyleneglycol, triethyleneglycol, tetraethyleneglycol, dipropyleneglycol and the like. Suitable polyols which can be combined with the polyol of formula [II] include polyethyleneglycol, polypropyleneglycol, 1, 3-butanediol, 1, 4-butanediol and the like. If the polyol of formula

is principably used as the polyol component, the resulting photopolymerized products have good hardness and excellent solvent resistance, which are excellent characteristics when the exposed composition is used as a relief for pattern plates in the preparation of a matrix or as a relief for preparing ornaments. If the polyol of formula [II], wherein $n$ is an integer of 3-5, is principably used as the polyol component, the resulting photopolymerized products have excellent water resistance, elasticity and solvent resistance which are especially desirable characteristics when the product is used as a printing plate.

The unsaturated polyester can be produced by polycondensing a carboxylic acid compound of formula [I] with a polyol of formula [II] at a temperature less than 240° C under dihydration conditions. They can also be prepared by ester interchange of a di-lower alkyl ester of the carboxylic acid of formula [I] with the polyol of formula [II] at a temperature less than 240° C. It is preferable to use a catalyst in the ester interchange reaction such as alkoxides; hydroxides and acetates of Li, Na, Mg, K or Ca; alkoxides, oxides, chlorides, and acetylacetone salts of Ti, Zr, V, Cr, Mn, Fe, Ni, Co, Cu, Zn, Ge, Cd, Sn, Sb, Bi and Pb.

In order to improve the resolving power of the image formed by using the photopolymerizable composition, it is preferable to use a modified unsaturated polyester having an acid value of 5-100. If the acid value of the unsaturated polyester is less than 5, it is hard to improve the resolving power of the image. On the contrary, when an unsaturated polyester having an acid value greater than 100 is used, the resulting photopolymerized product has inferior flexibility, water resistance and solvent resistance and inferior resolving power of the resultant image. In order to produce an unsaturated polyester having an acid value 5-100, the appropriate ratio of the component to the carboxylic acid component is selected. However, the polyester is preferably produced as follows. An unsaturated polyester having one or more terminal hydroxyl groups (hydroxyl value of 5-200) is produced by polycondensing the polyol with the polycarboxylic acid or a derivative thereof, preferably by polycondensing the carboxylic acid compound of formula [I] with the polyol of formula [II]. Thereafter, a modified unsaturated polyester having an acid value of 5-100 is produced by reacting a polycarboxylic acid with the prepared unsaturated polyester. If an unsaturated polyester having a hydroxyl value of less than 5 is used, it is difficult to improve the resolving power of the image of the photopolymerizable composition. On the other hand, if an unsaturated polyester having a hydroxyl value greater than 200 is used, the flexibility, water resistance and solvent resistance of the photopolymerized part of the photopolymerizable composition are inferior and the resolving power of the resultant image is not sufficient.

In the present composition it is preferable to use an unsaturated polyester having a molecular weight (MW) of 600-11,000. If the molecular weight is less than 600, the flexibility, water resistance and solvent resistance of the photopolymerized part of an exposed composition are inferior. If the molecular weight is greater than 11,000, the resolving power of the image is disadvantageously inferior.

Suitable polycarboxylic acids and anhydrides thereof used in the preparation of the polyester include maleic acid, fumaric acid, succinic acid, phthalic acid, itanconic acid, trimellitic acid and anhydrides thereof. Conventional esterification procedures can be applied to modify the unsaturated polyester having terminal hydroxyl groups with the polycarboxylic acid or anhydride thereof. If a modified unsaturated polyester having an acid value of 5-100, which is produced by reacting a carboxylic acid component containing more than 40 mole % of the carboxylic acid [I] to the total carboxylic acid content with a polyol component containing more than 30 mole % of the polyol [II] to the total polyol content, is used, the resulting photopolymerized product have excellent resolving power of the resultant image and high flexiblity, water resistance and solvent resistance.

Suitable photopolymerizable unsaturated monomers used in the photopolymerizable composition of the invention include acrylic acid, methyacrylic acid, acrylates and methacrylates such as methyl(meth-)acrylate, ethyl(meth-)acrylate, n-propyl(meth-)acrylate, n-butyl(meth-)acrylate, hydroxyethyl(meth-)acrylate, hydroxypropyl(meth-)acrylate, dimethylaminoethyl(meth-)acrylate, diethylaminoethyl(meth-)acrylate, glycidyl(meth-)acrylate, tetrahydrofurfuryl(meth-)acrylate, propyleneglycol(meth-)acrylate hydrogenmaleate, propyleneglycol(meth-)acrylate hydrogen phthalate, ethyleneglycol(meth-)acrylate hydrogen maleate, ethyleneglycol(meth-)acrylate hydrogen phthalate; diacrylates or dimethacrylates of polyester (meth-)acrylates such as ethyleneglycol di(meth-)acrylate, diethyleneglycol di(meth-)acrylate, triethyleneglycol di(meth-)acrylate, tetraethyleneglycol di(meth-)acrylate, polyethyleneglycol di(meth-)acrylate, 2,2-bis(4-acryloyloxydiethoxy)propane, 2,2-bis(4-methacryloyloxyethoxy)propane, 1,3-butyleneglycol di(meth-)acrylate, 1,6-hexanediol di(meth-)acrylate, neopentylglycol di(meth-)acrylate, dipropyleneglycol di(meth-)acrylate, bis(ethyleneglycol)phthalate di(meth-)acrylate, bis(diethyleneglycol)sebacate di(meth-)acrylate, poly(ethyleneglycol phthalate) di(meth-)acrylate; glycerine di(meth-)acrylate, polyfunctional (meth-)acrylates having three or more (meth-)acryloloxy groups such as trimethylolethane tri(meth-)acrylate, trimethlolpropane tri(meth-)acrylate, glycerine tri(meth-)acrylate, pentaerythritol tri(meth-)acrylate, pentaerythritol tetra(meth-)acrylate, dipentaerythritol tetra(meth-)acrylate, 1,3,5-triacryloxy hexahydro-S-triazine; styrene and styrene derivatives such as o,m,p-methylstyrenes, o,m,p-aminostyrenes, o,m,p-carboxystyrenes, (meth-)acrylamides such as (meth-)acrylonitrile, (meth-)acrylamide, N-methylol(meth-)acrylamide, N-butoxymethylol(meth-)acrylamide, diacetone(meth-)acrylamide, N,N'-methylene bis(meth-)acrylamide, N,N'-hexamethylene bis(meth-)acrylamide, N,N'-xylylene bis(meth-)acrylamide; diacrylphthalate, triallylcyanurate, N-vinyl phthalimide, N-vinylsuccinic imide and the like. It is preferable to use acrylates and methacrylates as the photopolymerizable unsaturated monomer, especially the photopolymerizable unsaturated monomers having two or more acryloyloxyl groups. The use of such unsaturated monomers results in a photopolymerizable composition whose photopolymerizing speed is high. Also the fogging phenomenon is decreased (resolving power is increased) and the resulting photopolymerized product has excellent mechanical strength, hardness, solvent resistance, and printing press resistance. Accordingly, it is preferable to mix 5 - 70 wt. % of at least one of the photopolymerizable unsaturated monomers with 30 - 95 wt. % of the unsaturated polyester having an acid value of 5-100 in the composition. If the amount of the photopolymerizable unsaturated monomer incorporated in the composition is less than the indicated range, the photopolymerization reaction velocity upon irradiation of the photopolymerizable composition is low and the strength of the photopolymerized product is disadvantageously low. If the amount of the photopolymerizable unsaturated monomer is greater than this range, the water resistance of the photopolymerized product is disadvantageously low. In order to use the photopolymerizable composition of the invention for image formation as a printing plate for relief printing, it is necessary that the photopolymerized product prepared from the photopolymerizable composition have excellent flexibility and wear resistance as well as giving high depth of relief. The appropriate choice of the photopolymerizable unsaturated compound is an important factor in achieving these objectives. When at least one monomer selected from acrylic acid, methacrylic acid and hydroxyl esters thereof, and at least one photopolymerizable unsaturated monomer having two or more (meth-)acryloyl groups, especially di(meth-)acrylates acrylates thereof are combined in a desired ratio, the desired photopolymerizable compounds which attain the present objective can be obtained. The former components include acrylic acid, methacrylic acid and hydroxyl esters thereof such as hydroxyethyl(meth-)acrylate, 2-hydroxypropyl (meth-)acrylate, 2- and 3-hydroxybutyl (meth-)acrylate, 1-methyl, 3hydroxypropyl(meth-)acrylate, diethyleneglycol mono(meth-)acrylate, triethyleneglycol mono(meth-)acrylate tetraethyleneglycol mono(meth-)acrylate, polyethyleneglycol mono(meth-)acrylate, glycerine mono(meth-)acrylate, hexyleneglycol mono(meth-)acrylate, pentaerythritol mono(meth-)acrylate and the like. It is preferable to combine 5-95 wt. % of acrylic acid, methacrylic acid or a hydroxyl ester thereof and 95-5 wt. % of di(meth-)acrylate, which results in a photopolymerizable composition which exhibits high photopolymerization reaction velocities (photohardening velocities) and the relief prepared by using the composition has high depth of a relief and has high reproducibility of the fine lines of the image. When the relief is used for printing, the printing ink does not fill in the non-image portion of the relief which means that clear images can be printed. The relief was excellent strength, and no cracks or breaks appear in the relief when it is used in printing operations on a rotary press. When the photopolymerizable composition of the invention is used for pattern plates in the preparation of matrixes, the photopolymerized product prepared upon exposure to light and subsequent development should have high depth from concave to convex, high wear resistance, flexibility, hardness, strength and water resistance. In order to attain these objectives the appropriate selection of the photopolymerizable saturated monomer and the crosslinkable unsaturated compound are important factors. In order to satisfactorily attain these objectives, it is preferable to use more than 30 wt. % of a triacryloyl or trimethacrylol compound having the formula

[III]

-continued

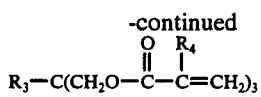

wherein $R_3$ represents hydrogen, methyl, ethyl or methylol and $R_4$ represents hydrogen or methyl. Suitable compounds of formula [III] include trimethylolmethane tri(meth-)acrylate, trimethylolethane tri(meth-)acrylate, trimethylolpropane tri(meth-)acrylate, glycerine tri(meth-)acrylate, pentaerythritol tri(meth-)acrylate and the like. It is possible to add less than 70 wt. % of the other unsaturated compound.

The photosensitizers used in the photopolymerizable composition of the present invention are compounds which sensitize the photopolymerizable components upon irradiation by light having wavelengths of 2000-7000 A. When the photosensitizer is added to the composition, it is preferable to use a composition having a carbonyl group and which absorbs at 2800 A-4000 A. so as to impart excellent photopolymerizability to the composition. Suitable photosensitizers include benzoin, benzoin alkyl ethers, benzoin allyl ethers, benzoin silyl ethers, benzophenones, anthraquinones, benzil, diacetyl and mixtures thereof and the like. The photosensitizer is preferably added to the photopolymerizable composition in amounts of 0.01-10 wt. % If the photosensitizer content is less than 0.01 wt. % the photopolymerization velocity is too slow. If the photosensitizer content is greater than 10wt. % the mechanical properties and the stability in storage disadvantageously deteriorate. Preferably, a thermal polymerization inhibitor is mixed into the composition in amounts of 0.01-10 wt.% which stabilizes the composition for storage. Suitable inhibitors include phenols, hydroquinones, catechols and the like.

In order to prepare a relief using the photopolymerizable composition of the invention, the photopolymerizable composition is spread over a substrate in a thickness of 0.1 - 10 mm to form a photopolymerizable layer. The photopolymerizable layer can adhere to the substrate if desired. Suitable substrates include metal plates of iron, stainless steel, aluminum, and the like; synthetic rubber sheets of styrene-butadiene rubber, acrylonitrile-butadiene rubber, ethylene-propylene rubber, and the like; synthetic resin sheets of polyethylene, polypropylene, polystyrene, polymethylmethacrylate, polyvinylchloride, polyethyleneterephthalate, and the like. A negative film is laid over the photopolymerizable layer of the product, and it is irradiated by light having wavelengths of 2000 - 7000 A for 20 seconds to 10 minutes so as to harden the polymerizable part of the photopolymerizable layer. After irradiation, the photopolymerizable layer is washed with a weak aqueous alkaline solution or an aqueous alcoholic solution to wash out the non-image part of the photopolymerizable layer.

The resulting relief has excellent chemical and physical properites, e.g. hardness, flexibility, water resistance, solvent resistance, and the like, and it can be used as a printing plate or a pattern plate in the preparation of a matrix. The photopolymerizable composition of the present invention for image formation has excellent photopolymerizability and developing properties and the product prepared by using the photopolymerizable composition has excellent image reproducibility and excellent hardness, solvent resistance, water resistance and durability. Accordingly, the photopolymerizable composition can be used in the preparation of reliefs for printing and print wiring plates, as etching resistors for copper foil, as photo-bonding agents for glass, methacryl resin, and the like, as coating material, as a molding polymerizable resin or as a display and the like.

Having now generally described this invention, a further understanding can be obtained by reference to certain specific examples which are provided herein for purpose of illustration only and are not intended to be limited unless other specified. In the examples, the molecular weight (MW) was calculated from the acid value or hydroxyl value unless otherwise specified.

EXAMPLE 1 a. Production of unsaturated polyesters

Into a flask equipped with a stirrer, a nitrogen inlet, a thermometer and a condenser, α-methylene-δ-methyl adipic acid dimethyl ester, dimethyl adipate and triethyleneglycol in the ratios shown in Table 1, and 2.0 wt. parts of zinc acetate as a catalyst were introduced. After purging the flask with nitrogen, the mixture was reacted under a nitrogen atmosphere at 170° C with stirring whereby an unsaturated polyester having hydroxyl groups was obtained.

b. Modification of unsaturated polyester

Into a separate flask equipped with a stirrer, a nitrogen inlet, a thermometer and a condenser, 10.0 parts by wt. of the unsaturated polyester shown in Table 1 and 0.12 part by wt. of phthalic anhydride were charged, and the mixture was stirred at 120° C for 30 minutes under a nitrogen atmosphere whereby a modified unsaturated polyester having an acid value of 8 was obtained.

c. Preparation of a photopolymerizable composition 8.00 parts by wt. of each of the modified unsaturated polyesters (b) shown in Table 1 were admixed with 1.00 part by wt. of hydroxypropyl methacrylate, 0.50 part by wt. of ethyleneglycol dimethacrylate, 0.50 part by wt. of triethyleneglycol diacrylate, 0.20 part by wt. of benzoin methyl ether and 0.0020 part by wt. of hydroquinone with stirring whereby photopolymerizable compositions were obtained.

d. Preparation of a relief

Each of the photopolymerizable compositions (c) was spread onto an aluminum plate covered with an adhesive layer to prepare a photoplymerizable plate having a thickness of 0.7 mm. The photopolymerizable layer on the plate was coated with a polyester film having a thickness of 10μ and a negative film having 133 lines and a dot area of 50% was overlapped and was exposed for 3 minutes from a distance of 5 cm by a 20 W luminescent lamp to initiate the chemical reaction. A 0.1% aqueous solution of sodium hydroxide was used as the developing solution which was sprayed through a nozzle from a distance of 20 cm under an injection pressure of 1.5 Kg/cm² for 3 minutes onto the exposed surface to develop it. Thereafter, the plate was dried by hot air at 80° C for 10 minutes and was exposed from a distance of 5 cm with a 20 W luminescent lamp to start the chemical reaction to obtain a relief image. The depth of the relief image in the non-image portion was measured as the grade of development factor by using a needle touch type depth tester. The strength, elongation and swelling degree of the relief after dipping the hardened product in acetone for 48 hours at 30° C were measured. The results are shown in Table 1.

TABLE 1

| Test No. | Example 1-1 | 1-2 | 1-3 | 1-4 |
|---|---|---|---|---|
| Compositions of polyester charged (wt. part) | | | | |
| α-methylene-δ-methyl adipic acid dimethyl ester | 140 | 140 | 140 | 140 |
| dimethyl adipate | 52.2 | 52.2 | 52.2 | 52.2 |
| triethyleneglycol | 150 | 150 | 150 | 220 |
| Reaction time (hr) | 10 | 5 | 1 | 2 |
| Hydroxyl value of unsaturated ester (measured) | 8 | 21 | 60 | 154 |
| Molecular weight | 7000[a] | 2700[b] | 950[b] | 750[b] |
| Depth of relief (μ)[c] | 26 | 35 | 46 | 51 |
| Physical properties | | | | |
| Tensile strength at break (Kg/cm²) | 205 | 185 | 173 | 150 |
| Elongation (%) | 83 | 79 | 72 | 61 |
| Swelling degree | 0.01 | 0.01 | 0.01 | 0.05 |

| Test No. | 1-5[d] (Reference) | 1-6 | 1-7 |
|---|---|---|---|
| Compositions of polyester charged (wt. part) | | | |
| α-methylene-δ-methyl adipic acid dimethyl ester | 140 | 140 | 140 |
| dimethyl adipate | 52.2 | 52.2 | 52.2 |
| triethyleneglycol | 150 | 150 | 280 |
| Reaction time (hr) | 25 | 0.5 | 1 |
| Hydroxyl value of the unsaturated ester (measured) | 4 | 110 | 217 |
| Molecular weight | 14000[a] | 500[b] | 500[b] |
| Depth of relief (μ)[c] | 10 | 53 | 56 |
| Physical properties | | | |
| Tensile strength at break (Kg/cm²) | 210 | 42 | 45 |
| Elongation (%) | 85 | 21 | 20 |
| Swelling degree | 0.01 | 0.20 | 0.20 |

Note *
[a] MW is calculated from the hydroxy value
[b] MW is measured by liquid chromatography
[c] 50% dot area; half tone dots of 133 lines per inch; the relief is prepared by washing out the same with 0.1 % NaOH aq. sol.
[d] It is modified to have acid value of 4.

EXAMPLE 2 a. Production of unsaturated polyester

Into a flask equipped with a stirrer, a nitrogen inlet, a thermometer and a condenser, 180 parts by wt. of α-methylene-δ-methyl adipic acid dimethyl ester, 19.4 parts by wt. of dimethyl adipate 290 parts by wt. of tetraethyleneglycol and 2.0 parts by wt. of zinc acetylacetonate were charged. After purging the flask with nitrogen, the mixture was stirred at 170° C for 60 minutes under a nitrogen atmosphere to obtain an unsaturated polyester having a hydroxyl value of 120 (MW 950).

b. Modification of unsaturated polyester

Into a separate flask equipped with a stirrer, a nitrogen inlet, a thermometer and a condenser, 10 parts by wt. of the unsaturated polyester (a) and phthalic anhydride in the indicated amounts were stirred under nitrogen at 120° C for 15 minutes whereby modified unsaturated polyesters were obtained having the acid values shown in Table 2.

c. Preparation of photopolymerizable composition 8.00 parts by wt. of each of the modified unsaturated polyesters (b) having the acid values shown in Table 2, were admixed with 1.00 part by wt. of 2-hydroxyethyl methacrylate, 1.00 part by wt. of tetraethyleneglycol dimethacrylate, 0.20 prt by wt. of benzoin cyclohexyl ether and 0.002 part by wt. of hydroquinone with stirring to obtain photopolymerizable compositions.

d. Preparation of relief

In accordance with method (d) of Example 1, each relief was prepared, and the depth of the relief in the non-image portion and the swelling dgree after dipping in acetone at 30° C for 48 hours were measured. The results are shown in Table 2. The printing plates using the modified unsaturated polyesters having an acid value of 5 - 100 had balanced depth of relief and solvent resistance and clear printed material was obtained by using the plates.

Table 2

| Test No | 2-1 | 2-2 | 2-3 | 2-4 | 2-5 | 2-6 | 2-7 | 2-8 | 2-9 |
|---|---|---|---|---|---|---|---|---|---|
| Amount of phthalic anhydride used for modification of unsaturated polyester (wt. part) | 0 | 0.079 | 0.185 | 0.26 | 0.49 | 1.32 | 2.00 | 2.90 | 4.10 |
| Acid value of modified unsaturated polyester (measured) | — | 2.3 | 5.8 | 10.2 | 19 | 44 | 62 | 83 | 110 |
| Depth of relief (μ) | 5 | 10 | 25 | 31 | 35 | 49 | 67 | 75 | 80 |

Table 2-continued

| Test No | 2-1 | 2-2 | 2-3 | 2-4 | 2-5 | 2-6 | 2-7 | 2-8 | 2-9 |
|---|---|---|---|---|---|---|---|---|---|
| Swelling degree | 0.01 | 0.01 | 0.01 | 0.02 | 0.03 | 0.06 | 0.06 | 0.07 | 0.20 |

EXAMPLE 3

A 0.7 mole quantity of α-methylδ-methylene adipic acid, 0.3 mole of adipic acid, 0.5 mole of diethyleneglycol and 0.5 mole of 1, 4-butanediol were mixed and reacted under nitrogen at 140° – 150° C for 20 hours to obtain an unsaturated polyester having an acid value of 20. (MW 2800). A 70 g amount of the unsaturated polyester was admixed with 15 g of propane-triacrylate, 15 g of diethyleneglycol dimethacrylate, 2 g of benzoin isopropyl ether and 0.5 g of hydroquinone to obtain a photopolymerizable composition. The photopolymerizable composition was spread over an aluminum plate coated with an adhesive layer to prepare a photopolymerizable layer having a thickness of 1 mm. The photopolymerizable layer of the plate was covered with a thin polyester film and a negative having transparent image portions was placed over the polyester film. The film layers were exposed to light from a 3 KW high pressure mercury lamp for 1.5 minutes from a distance of 60 cm. After exposure, the plate was developed with 0.1% aqueous NaOH solution to obtain a relief. The hardness of the relief was 88, and after aging for 1 month, the hardness of the relief had only decreased to a value of 86 (Barcol hardness). The matrixes were made from the relief at the time of preparation of the relief and after aging the relief for 1 month. Lead plates were prepared from the matrixes and used to prepare printed material. The results are shown in Table 3.

Table 3

| | Negative film | Printed Matter | |
|---|---|---|---|
| | | At the time of preparation | After aging the relief for one month |
| Reproducibility of image lines (width of line) | 90 μ 205 μ 290 μ | 92 μ 205 μ 300 μ | 90 μ 205 μ 300 μ |
| Dot area | 10 % 50 % 90 % | 10 % 50 % 90 % | 10 % 50 % 90 % |
| Reproducibility of dot area; 65 lines/inch | | | |

The resistance for taking the matrix was good and the reproducibility for repeating the preparation of the matrix was excellent.

As a comparative experiment, the method was repeated except that 0.2 mole of α-methylene-δ-methyl adipic acid and 0.8 mole of adipic acid were used and the preparation of a relief was repeated. The hardness of the relief was 63 and after one month of aging, it decreased to 40 (Barcol hardness). A matrix press using the relief was unsatisfactory.

EXAMPLE 4 a. Production of unsaturated polyester

In a flask were mixed and reacted 140 parts by wt. of α-methyl δ-methylene adipic acid dimethyl ester, 58.2 parts by wt. of dimethyl phthalic acid, 194 parts by wt. of tetraethyleneglycol, and 0.4 part by wt. of titanium tetrabutoxide under a nitrogen gas atmosphere at 170° C for 3 hours whereby an unsaturated polyester having a hydroxyl value of 28 (MW 2000) was obtained.

b. Modification of the unsaturated polyester 10 parts by wt. of the unsaturated polyester (a) were admixed with 0.53 part by wt. of phthalic anhydride and the mixture was reacted at 120° C for 20 minutes whereby a modified unsaturated polyester having an acid value of 20 was obtained.

c. Preparation of photopolymerizable composition

A 70 g amount of the modified unsaturated polyester (b) was admixed with stirring with 12 g of hydroxyethyl methacrylate, 18 g of diethyleneglycol dimethacrylate, 1.7 g of benzoinphenyl ether and 10 mg of hydroquinone whereby a photopolymerizable composition was obtained.

d. Preparation of relief

The photopolymerizable composition (c) was spread over an aluminum plate coated with an adhesive layer to prepare a photopolymerizable plate having a thickness of 1 mm. The photopolymerizable layer of the plate was covered with a thin polyester film and then a negative having transparent image parts was applied over the layers. The film layers were exposed to a 20 W luminescent lamp from a distance of 5 cm for 3 minutes to promote the chemical reaction. After exposure the photopolymerizable plate was developed with a 1% aqueous sodium hydroxide solution to obtain the relief image. As a reference experiment, the method was repeated except that 0.2 mole of tetraethyleneglycol and 0.8 mole of ethyleneglycol (Ref. 1) or 0.8 mole of polyethyleneglycol having a molecular weight of 1,000 (Ref. 2) were used instead of 1.0 mole of tetraethyleneglycol to prepare the relief. The depth of the relief (133 lines; dot rea of 50%) and the swelling degree after dipping in water and acetone at 30° C for 48 hours are shown in Table 4.

Table 4

| | Depth of relief (μ) | Swelling degree | |
|---|---|---|---|
| | | water | acetone |
| Exp. 4 | 55 | 0.05 | 0.04 |
| Ref. 4-1 | 14 | 0.01 | 0.01 |
| Ref. 4-2 | 60 | 0.45 | 0.31 |

EXAMPLE 5 a. Production of unsaturated polyester

In a flask were mixed and reacted 140 parts by wt. of α-methyl-δ-methlenadipic acid dimethyl ester, 43.8 parts by wt. of dimethyl succinate, 150 parts by wt. of triethylene glycol and 6 parts by wt. of zinc acetate under a nitrogen gas atmosphere at 170° C for 2 hours whereby an unsaturated polyester having a hydroxyl value of 35 (MW 1600) was obtained.

b. Modification of unsaturated polyester 10 parts by wt. of the unsaturated polyester (a) were admixed with 0.33 part by wt. of succinic anhydride and unreacted at 120° C for 20 minutes whereby a modified unsaturated polyester having an acid value of 22 was obtained.

c. Preparation of photopolymerizable composition

A 70 g amount of the modified unsaturated polyester (b) was admixed with stirring with 18 g of hydroxypropyl methacrylate, 12 g of triethyleneglycol dimethacrylate, 1.5 g of benzoin sec-butyl ether and 0.5 g of hydroquinone whereby a photopolymerizable composition was obtained.

d. Preparation of relief

The photopolymerizable composition (c) was spread on an adhesive layer of polyester film having a thickness of 100μ to prepare a photopolymerizable plate having a thickness of 1 mm. The plate was covered with a thin polyester film and a negative having transparent image portions. The film layers were exposed to a 2 KW mercury lamp from a distance of 50 cm for 1.5 minutes. After exposure, the photopolymerizable plate was developed with a 0.1% aqueous sodium carbonate solution to obtain a relief image. The resulting image was clear and no fogging was observed. The depth of the prepared relief having a dot area of 80% and 120 lines per inch in the non-image portions was 75μ. The relief was used for printing in a rotary press. As the result, good printed matter which reproduces the negative film in precise had been obtained.

EXAMPLE 6

α-Methylene-δ-methyl adipic acid, the saturated acids and polyols shown in Table 1 in the ratios indicated were charged into a reactor and the mixture was heated at 180° C for 8 hours to produce unsaturated polyesters. Each of the unsaturated polyesters was admixed with a photopolymerizable unsaturated compound shown in Table 5; 1.2 g of benzoin isobutyl ether, 0.1 g of benzil and 0.2 g of hydroqunione to prepare a photopolymerizable composition. In accordance with the method of Example 1, each relief prepared was evaluated. The results are shown in Table 5.

EXAMPLE 7 a. Production of unsaturated polyester

In the flask of Example 1 were charged 180 parts by wt. of α-methylene-δ-methyl adipic acid dimethyl ester, 19.4 parts by wt. dimethyl phthalate, 150 parts by wt. of triethyleneglycol and 0.70 part by wt. of titanium tetrabutoxide. In accordance with the method (a) of Example 1, the reaction was conducted at 160° C for 90 minutes whereby an unsaturated polyester having a hydroxyl value of 52 (M.W. 1100) was obtained.

b. Modification of unsaturated polyester

In the flask of Example 1 were charged and heated 10.0 parts by wt. of the unsaturated polyester, 1.0 part by wt. of maleic anhydride and 0.1 part by wt. of diethylaminoethyl methacrylate at 110° C for 20 minutes whereby a modified unsaturated polyester having an acid value of 49 was obtained.

c. Preparation of photopolymerizable composition

The modified unsaturated polyester was admixed with hydroxyethylacrylate in the ratios shown in Table 6, 0.2 part by wt. of anthraquinone and 0.0020 part by wt. of hydroquinone with stirring whereby a photopolymerizable composition was obtained.

d. Preparation of relief

The photopolymerizable composition (c) was spread over an adhesive polyester sheet having a thickness of 100μ to prepare a photopolymerizable plate having a thickness of 0.7 mm. In accordance with the method of Example 1, the photopolymerizable plate was developed with water and a 5% aqueous sodium carbonate solution to prepare reliefs and the strength elongation and swelling degree of the same in water and acetone were measured. The results are shown in Table 6.

Table 5

| Test No. | 5 - 1 | 5 - 2 | 5 - 3 | 5 - 4 | 5 - 5 |
|---|---|---|---|---|---|
| Composition charged (mole) | | | | | |
| α-methylene-δ-methyl adipic acid | 0.5 | 0.8 | 0.6 | 1.0 | 0.5 |
| Saturated acid | | | | | |
| phthalic anhydride | 0.5 | | 0.4 | — | |
| terephthalic acid | | 0.2 | | — | |
| adipic acid | | | | — | 0.5 |
| Polyol | | | | | |
| diethyleneglycol | 1.0 | | | | |
| tetraethyleneglycol | | 1.0 | | | |
| triethyleneglycol | | | 1.0 | 0.5 | |
| tetraethyleneglycol | | | | 0.5 | 1.0 |
| Unsaturated polyester (g) | 85 | 70 | 60 | 75 | 80 |
| Photopolymerizable unsaturated compound(g) | | | | | |
| 3-hydroxypropyl acrylate | 5 | | | | |
| hydroxyethylacrylate | | 15 | 5 | 10 | |
| pentaerythritol monoacrylate | | | | | 10 |
| ethyleneglycol dimethacrylate | 10 | | | | |
| diethyleneglycol dimethacrylate | | 15 | | 15 | |
| tetraethyleneglycol dimethacrylate | | | 35 | | |
| tetramethyleneglycol dimethacrylate | | | | | 10 |
| Exposure time (min.) | 2 | 1.5 | 1 | 1.5 | 2 |
| Depth of relief (μ)* | 70 | 60 | 55 | 70 | 70 |
| Condition of image | good | good | good | good | good |

Note: *(120 lines per inch; dot area of 80%)

Table 6:

| Test No. | 6-1 | 6-2 | 6-3 | 6-4 |
|---|---|---|---|---|
| Unsaturated polyester | 100 | 90 | 60 | 20 |
| Hydroxyethyl methacrylate | 0 | 10 | 40 | 80 |
| Physical properties | | | | |
| Tensile strength (Kg/cm$^2$) | 30 | 105 | 390 | 530 |
| Elongation (%) | 10 | 30 | 73 | 10 |
| Swelling degree | | | | |
| in water | 1.50 | 0.03 | 0.04 | 0.80 |
| in acetone | 1.80 | 0.14 | 0.15 | 1.00 |

EXAMPLE 8 a. Production of unsaturated polyester

In the flask of Example 1 were charged 120 parts by wt. of α-methylene-δ-methyl adipic acid dimethyl ester, 70 parts by wt. of dimethyl adipate, 106 parts by wt. of triethyleneglycol and 1.5 parts by wt. of lead acetate as a catalyst. In accordance with the method (a) of Example 1, the reaction was conducted at 170° C for 120 minutes whereby an unsaturated polyester having a hydroxyl value of 42 (MW 1350) was obtained.

b. Modification of unsaturated polyester

In the flask of Example 1, 10.0 parts by wt. of the unsaturated polyester and 0.8 part by wt. of citraconic acid were charged and reacted at 110° C for 20 minutes whereby a modified unsaturated polyester having an acid value of 36 was obtained.

c. Preparation of photopolymerization composition

The modified unsaturated polyester was admixed with the vinyl monomer shown in Table 7, and 0.10 part by wt. of benzoin isopropyl ether, 0.01 part by wt. of benzophenone, and 0.0020 part by wt. of hydroquinone with stirring whereby a photopolymerizable composition was obtained.

d. Preparation of relief

The photopolymerizable composition (c) was spread over an adhesive polyester sheet having a thickness of 100μ to prepare a photopolymerizable plate having a thickness of 0.7 mm. In accordance with the method of Example 1, relief plates were prepared by using the plate and the relief plates were evaluated. The results are shown in Table 7.

Table 7

|  | Exp. 7-1 | Ref. 7-1 | Ref. 7-1 |
|---|---|---|---|
| Unsaturated polyester | 70 | 70 | 70 |
| Vinyl monomer: | | | |
| hydroxypropyl methacrylate | 10 | 30 | 0 |
| triethyleneglycol dimethacrylate | 20 | 0 | 30 |
| Exposure time (min.) | 2 | 5 | 1 |
| Depth of relief * (μ) | 70 | 30 | 5 |
| Condition of image | good | high fog swing of fine line | good appearance |

Note: * (120 lines per inch; dot area of 80%)

EXAMPLE 9 a. Production of unsaturated polyester

In a flask 100 parts by wt. of α-methylene-δ-methyladipic acid dimethyl ester, 73 parts by wt. of dimethyl succinate, 106 parts by wt. of diethyleneglycol, and 5 parts by wt. of magnesium acetate were mixed and reacted under a nitrogen gas atmosphere at 180° C for 5 hours whereby an unsaturated polyester having a hydroxyl value of 36 (MW 1550) was obtained.

b. Modification of unsaturated polyester 10 parts by wt. of the unsaturated polyester (a) were admixed with 0.45 part by wt. of maleic anhydride and 0.01 part by wt. of dimethyl aminoethyl methacrylate and reacted at 90° C for 20 minutes whereby a modified unsaturated polyester having an acid value of 20 was obtained.

c. Preparation of photopolymerizable composition

An 80 g amount of modified unsaturated polyester (b) was admixed with 10 g of pentaerythritol trimethyacrylate, 10 g of diethyeneglycol dimethacrylate, 2.0 g of benzoin isopropyl ether, 0.1 g of benzyl and 0.5 g of hydroquinone with stirring where a photopolymerizable composition was obtained.

d. Preparation of relief

In accordance with the process of Example 1 the photopolymerizable composition (c) was used to prepare a relief upon exposure to light for 2 minutes. The relief had a Barcol hardness of 86. A lead mold was prepared from the matrix and it was used in a rotary press whereby a reproducibility of 65 lines per inch and a dot area of 5 - 95% was obtained. No broadening of the image line was found. As a reference experiment, the method was repeated except that (B) 20 g of diethyleneglycol dimethacrylate were used instead of (A) 10 g of pentaerythritol trimethacrylate and 10 g of diethyleneglycol dimethacrylate. The hardness of the relief prepared is as follows:

Table 8

| Type of unsaturated polyester | Barcol Hardness | |
|---|---|---|
|  | At the time of preparation | After 1 month ageing |
| (A) | 86 | 84 |
| (B) | 85 | 79 |

EXAMPLE 10 a. Production of unsaturated polyester

In a flask 140 parts by wt. of α-methylene-δ-methyl adipic acid dimethyl ester, 58.2 parts by wt. of dimethyl phthalate, 31 parts by wt. of ethyleneglycol, 75 parts by wt. of triethyleneglycol and 1 part by wt. of titanium tetraisopropoxide were mixed and reacted under a nitrogen gas atmosphere at 180° C for 2 hours whereby an unsaturated polyester having a hydroxyl value of 43 (ME 1300) was obtained.

b. Modification of unsaturated polyester 10 parts by wt. of the unsaturated polyester (a) were admixed with 0.7 g part by wt. of phthalic anhydride and 0.1 part by wt. of diethylaminoethyl methacrylate and reacted at 90° C for 20 minutes whereby a modified unsaturated polyester having an acid value of 30 was obtained.

c. Preparationn of photopolymerizable composition

A 75 g amount of the modified unsaturated polyester (b) was admixed with 20 g of trimethylol ethane trimethacrylate, 5 g of ethyleneglycol diacrylate, 1.5 g of benzoinethyl ether and 0.5 g of hydroquinone with stirring whereby a photopolymerizable composition was obtained.

d. Preparation of relief

A relief was prepared in accordance with the method of Example 1 by using the photopolymerizable composition (c). The relief had a Barcol hardness of 88 and a high reproducibility of 133 lines per inch and a dot area of 3 – 98%. The stability of the relief upon aging was good and the hardness of the relief after aging for 1 month was 85.

EXAMPLE 11 a. Production of unsaturated polyester

In a flask, were mixed and reacted 140 parts by wt. of α-methylene-δ-methyladipic acid dimethyl ester, 52.2 parts by wt. of dimethyl adipate, 134 parts by wt. of dipropyleneglycol and 6 parts by wt. of zinc acetate under a nitrogen gas atmosphere at 180° C for 2 hours whereby an unsaturated polyester having a hydroxyl value of 25 (MW 2250) was obtained.

b. Modification of unsaturated polyester 10.0 parts by wt. of the unsaturated polyester (a) were admixed and reacted with 0.44 part by wt. of maleic anhydride at 120° C for 30 minutes whereby a modified unsaturated polyester having an acid value of 25 was obtained.

c. Preparation of photopolymerizable composition

An 80 g amount of the modified unsaturated polyester (b) was admixed with 20 g of trimethylolpropane trimethacrylate, 1.5 g of benzoin methyl ether, 0.01 g of anthraquinone and 0.5 g of hydroquinone with stirring whereby a photopolymerizable composition was obtained.

d. Preparation of relief

A relief was prepared in accordance with the method of Example 1 using the photopolymerizable composition (c). The relief had a Barcol hardness of 87, and the hardness of the relief after aging for 1 month was 85. As a reference experiment, the method was repeated except that maleic anhydride was used instead of methacrylic acid dimer. The relief had a Barcol hardness of 75 but the hardness decreased to 52 upon aging for 1 month. When the method was repeated except that itaconic acid was used instead of methacrylic acid dimer, the resulting unsaturated polyester gelled during production.

EXAMPLE 12 a. Production of unsaturated polyester

In a flask, were mixed and reacted 140 parts by wt. of α-methylene-δ-methyl adipicacid dimethyl ester, 52.2 parts by wt. of dimethyl adipate, 31 parts by wt. of ethyleneglycol, 75 parts by wt. of triethyleneglycol and 0.5 parts by wt. of titanium tetrabutoxide under a nitrogen atmosphere at 180° C for 2 hours whereby an unsaturated polyester having a hydroxyl value of 30 (MW 1850) was obtained.

b. Modification of unsaturated polyester 10.0 parts by wt. of the unsaturated polyester (a) were admixed with 0.63 part of phthalic anhydride and reacted at 120° C for 20 minutes whereby a modified unsaturated polyester having an acid value of 24 was obtained.

c. Preparation of photopolymerizable composition

A 75 g amount of the modified unsaturated polyester (b) was admixed with 20 g of diethyleneglycol dimethacrylate, 5 g of bis(ethyleneglycol) phthalate dimethacrylate, 1.5 g of benzoin methyl ether and 0.5 g of hydroquinone with stirring whereby a photopolymerizable composition was obtained.

d. Preparation of relief

The photopolymerizable composition (c) was spread over a polymethylmethacrylate resin plate in a thickness of 2 mm to prepare a photopolymerizable plate. After covering the photopolymerizable layer of the plate with a polyester film having a thickness of 10μ and then with a negative having an image of "Mitsubishi Rayon", the layers were exposed for 3 minutes to a high pressure mercury lamp (3 KW) from distance of 50 cm. The exposed plate was developed with a 0.1% aqueous sodium hydroxide solution was washed with water and then dried. A relief plate having the image Mitsubishi Rayon was obtained. The relief had excellent adhesiveness to the resin plate, had high weather durability and was useful as a display.

EXAMPLE 13

Each photopolymerizable composition below was prepared by mixing 80 g of the modified unsaturated polyester of Example 10(b), 10 g of trimethylol-propane trimethacrylate, 10 g of pentaerythritol triacrylate, 0.5 g of hydroquinone and 2 g of one of the photosensitizers shown in Table 9. Each relief was prepared in accordance with Example 1(d) by using the respective photopolymerizable compositions. Hardening times for the reliefs were compared. The results are shown in Table 9.

Table 9

| Photosensitizer | Hardening time |
| --- | --- |
| benzoin methyl ether | 3 min. |
| benzoin propyl ether | 3 min. |
| diphenylsulfide | 20 min. |
| azobisisobutyronitrile | 40 min. |
| t-butyl peroxide | 40 min. |

Having now fully described this invention, it will be apparent to one of ordinary skill in the art that many changes and modifications can be made thereto without departing from the spirit or scope of the invention as set forth herein.

What is claimed as new and desired to be secured by letters patent of the United States is:

1. A photopolymerizable composition for image formation, which comprises:
   30 – 95 wt. % of an unsaturated polyester having an acid value of 5 – 100 which is the condensation product of a carboxylic acid component containing more than 40 mole % of a carboxylic acid compound having the formula

[I]

wherein $R_1$ represents hydrogen or a $C_{1-4}$ lower alkyl with a polyol component containing more than 30 mole % of a polyol having the formula $$HO-(R_2O)_n-H \quad [II]$$

wherein $R_2$ represents $C_{2-4}$ alkylene or a derivative thereof and $n$ is an integer of 2 - 5; and 70 - 5 wt. % of a photopolymerizable unsaturated monomer and a photosensitizer.

2. The photopolymerizable composition of claim 1, wherein said condensation product is modified by the incorporation of a polycarboxylic acid or an anhydride thereof.

3. The photopolymerizable composition of claim 1, wherein said unsaturated polyester having an acid value of 5 - 100 is produced by polycondensing a carboxylic acid component containing more than 40 mole % of said carboxylic acid compound of formula [I] with a polyol component containing more than 30 mole % of said polyol of formula [II] to obtain an unsaturated polyester having a hydroxyl value of 5 - 200 and then reacting a polycarboxylic acid or an anhydride thereof with said unsaturated polyester.

4. The photopolymerizable composition of claim 1, wherein said photopolymerizable unsaturated monomer is a combination of 5 - 95 wt. % of at least one monomer selected from the group consisting of acrylic acid, methacrylic acid and hydroxyesters thereof, and 95 - 5 wt.% of a second photopolymerizable unsaturated monomer.

5. The photopolymerizable composition of claim 4, wherein said second photopolymerizable unsaturated monomer is a photopolymerizable monomer containing more than two acryloyloxy or methacryloyloxy groups.

6. The photopolymerizable composition of claim 1, wherein said photopolymerizable unsaturated monomer is a mixture of monomers containing more than 30 wt. % of a compound having the formula $$R_3-C(CH_2O\overset{O}{\overset{\|}{C}}-\overset{R_4}{\underset{|}{C}}=CH_2)_3$$

wherein $R_3$ represents hydrogen, methyl, ethyl or methylol and $R_4$ represents hydrogen or methyl.

* * * * *